United States Patent [19]

Isoda et al.

[11] Patent Number: 5,211,762
[45] Date of Patent: May 18, 1993

[54] PHOTORESPONSIVE ELEMENT UTILIZING A MOLECULAR HETEROJUNCTION

[75] Inventors: Satoru Isoda; Satoshi Ueyama; Hiroaki Kawakubo; Mitsuo Maeda, all of Amagasaki, Japan

[73] Assignee: Mitsubishi Denki Kabushiki Kaisha, Japan

[21] Appl. No.: 500,496

[22] Filed: Mar. 28, 1990

[30] Foreign Application Priority Data

Mar. 29, 1989 [JP] Japan .................................. 1-79238

[51] Int. Cl.$^5$ .................... H01L 31/06; H01L 31/0344
[52] U.S. Cl. ...................... 136/263; 257/40; 257/431
[58] Field of Search ........ 136/263; 357/8, 16, 357/30 E, 30 J, 30 R, 30; 250/211 J, 212; 428/212

[56] References Cited

U.S. PATENT DOCUMENTS

| | | | |
|---|---|---|---|
| 4,360,703 | 11/1982 | Bolton et al. | 136/263 |
| 4,514,584 | 4/1985 | Fox et al. | 136/263 |
| 4,613,541 | 9/1986 | Isoda | 428/212 |
| 4,725,513 | 2/1988 | Eguchi et al. | 428/690 |
| 4,764,415 | 8/1988 | Isoda et al. | 428/212 |
| 4,764,416 | 8/1988 | Ueyama et al. | 428/212 |
| 4,783,605 | 11/1988 | Tomisawa et al. | 307/450 |

FOREIGN PATENT DOCUMENTS 1169066 6/1984 Canada .................................. 136/263

OTHER PUBLICATIONS

Saito et al., "Conducting Langmuir–Blodgett Films as Electrode Materials", *Thin Solid Films*, vol. 160, pp. 133–137 (1988).

Hua et al., "Photoelectric Properties of Substituted Silicon Phthalocyanine Langmuir Blodgett Film Schottky Barrier And Metal/Insulator/Semiconductor Devices", *Thin Solid Films*, vol. 149, pp. 163–170 (1987).

*Primary Examiner*—Aaron Weisstuch

[57] ABSTRACT

A photoresponsive element utilizing a molecular heterojunction includes a first redox material film, a second redox material film having a different redox potential from that of the first redox material film and disposed in contact with the first redox material film, a first electrode connected to the first redox material film, and a second electrode connected to the second redox material film. The photoresponsive element is photoconductive and photovoltaic.

6 Claims, 6 Drawing Sheets

F I G .1.
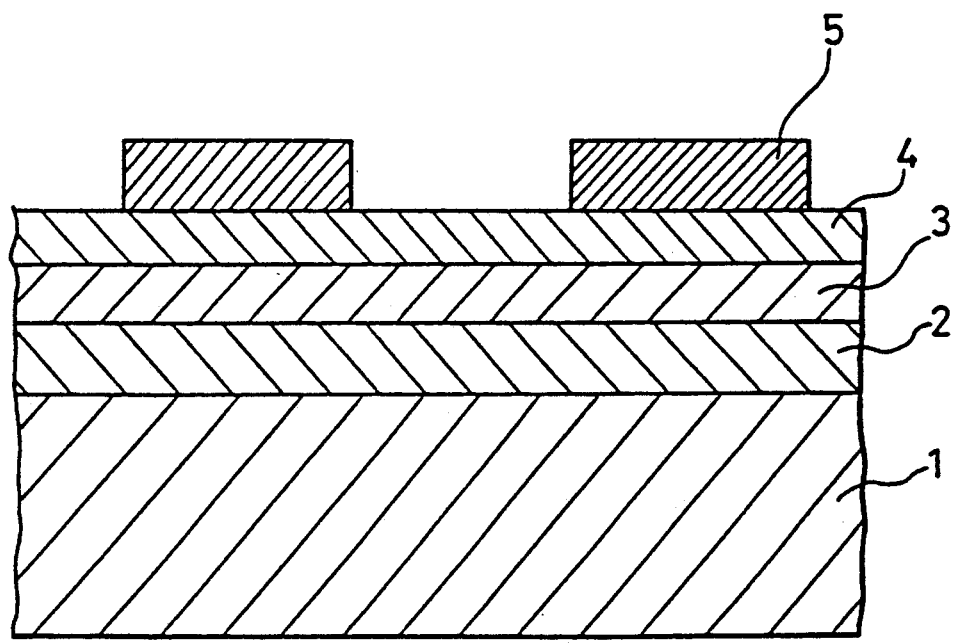

5,211,762

PHOTORESPONSIVE ELEMENT UTILIZING A MOLECULAR HETEROJUNCTION

FIELD OF THE INVENTION

The present invention relates to an optical element used in an integrated circuit. More particularly, the present invention relates to a photoresponsive element superior in photoconductive and photovoltaic effects.

BACKGROUND OF THE INVENTION

There has been much research and development on the photoelectric effect of inorganic and organic semiconductors. This effect is utilized in a variety of fields. Photoconductive and photovoltaic effects are well known and utilized in a variety of applications.

One example of a photoconductive material is cadmium sulfide. As shown in FIG. 5 taken from "Electronics Physics Engineering" by Masaharu Aoki, page 360, when a cadmium sulfide crystal is irradiated with light, the energy of the light generates a free electron and a free hole. When the electron and the hole pass through the crystal to the electrodes or to the electrode and from the crystal, the crystal is photoconductive.

A well known example of a photovoltaic element is a photocell including a semiconductor pn junction for detecting light. FIG. 6 illustrates this light responsive process in a semiconductor photodiode as described on page 304 of "Foundation of Opto-electronics" by A. Yariv, translated by Kunio Tada and Takeshi Kamiya. In FIG. 6, at a region A, an incident photon is absorbed at the p-type region, and a hole and an electron are generated. If the distance between the location where the hole and electron are generated and the depletion layer is less than an electron diffusion length, the electron reaches the depletion layer, drifts under the influence of the electric field, and traverses the depletion layer. At a region C, when the photon is absorbed close to the depletion layer in the n-type region, a hole generated in response diffuses toward the depletion layer and drifts through the depletion layer. A photon may also be absorbed in the depletion layer at a region B. Then, the generated hole and electron both drift under the influence of the electric field in opposite directions so that they reach the p-type side and n-type side, respectively.

The photovoltaic effect occurs in organic compounds as if a Schottky barrier were produced between a metal electrode and the organic compound. The organic compound layer generates carriers in response to the light absorption. An example is disclosed in detail in chapter 4 of D. A. Seanor's "Electrical Properties of Polymers".

Conventional photoresponsive elements, especially utilizing photoconductive and photovoltaic effects, are constituted as described above. The photoconductive property is utilized in a photosensitive plate or an optical sensor in photocopiers and the photovoltaic effect is utilized in solar cells or photosensors. The semiconductor pn junction can be produced in an MOS structure and fine patterning is possible. Thereby, a CCD image sensor with more than one million pixels has been made.

The high frequency response characteristics are important in a photoresponsive element because high sensitivity and high speed response are desired. In a conventional photoconductive element, the band structure of a semiconductor is exploited, and, in a photovoltaic effect element, a semiconductor pn junction or a metal semiconductor Schottky barrier is utilized. Since the diffusion time of carriers generated in the p-type or n-type region is finite and the width of the space charge layer at the pn junction or the Schottky barrier is finite, a delay occurs in response to incident light due to the transit time of the charge carriers. Therefore, in order to enhance the speed of response in conventional elements, it is necessary to shorten the time for the carrier transit by reducing the width of the space charge layer or the semiconductor layer. However, when the element is thin, the number of charge carriers produced and the sensitivity are reduced.

SUMMARY OF THE INVENTION

It is an object of the present invention to provide a high speed and highly sensitivity three-dimensional or hybrid photoresponsive element using two kinds of redox material films, such as heterojunction accumulative LB films, having different redox potentials.

Other objects and advantages of the present invention will become apparent from the detailed description given hereinafter. It should be understood, however, that the detailed description and specific embodiments are given by way of illustration only, since various changes and modifications within the spirit and scope of the invention will become apparent to those skilled in the art from the following detailed description.

An optical element in accordance with the present invention comprises a first redox material film, a second redox material film having a different redox potential from that of the first redox material and connected to the first redox material film, and electrodes respectively connected to the first redox material film and the second redox material film. The states of electrons in the first and second redox materials are controlled by irradiating the films with light, thereby exploiting the photoconductivity of the element.

According to the present invention, the junction of the two redox materials is photoresponsive, i.e., exhibits photoconductive or photovoltaic effects. As is shown by the schematic view of the A-B type redox material compound and the relationship between the energy levels thereof in FIGS. 4(a), 4(b), and 4(c), an electron in the highest occupied orbit of the molecule B can be excited to the lowest unoccupied orbit of the molecule B by light incident on a junction of redox material molecules A and B. The difference in the energy levels of the electron corresponding to the A and B molecular layer can be controlled. Therefore, it is possible to produce the photoconductive and photovoltaic effects. The energy levels of the A and B molecular layers may have a wide band broadening effect because of the crystallinity of the molecular layer.

BRIEF DESCRIPTION OF THE DRAWINGS

FIG. 1 is a diagram schematically showing a cross-sectional view of a photoresponsive element in accordance with an embodiment of the present invention;

DETAILED DESCRIPTION OF THE PREFERRED EMBODIMENTS

In the internal film of a biomembrane of a microorganism and in a mitochondrion in a higher order organism, there are a plurality of enzyme protein extracting electrons from reducing chemical substances, such as $H_2$, organic acids, NAD(P)H (nicotineamide adenine dinucleotide (phosphate)), as well as a plurality of proteins having an electron transfer function transferring extracted electrons in a predetermined direction of the biomembrane (hereinafter called electron transfer protein). These electron transfer protein molecules are embedded in the biomembrane in a predetermined orientation and they are arranged in a special molecular arrangement so that the electron transfer occurs between the molecules.

As discussed above, the electron transfer proteins are arranged in a chain with a precise arrangement in the biomembrane and, therefore, it is possible for an electron to flow along the protein chain and the movement of the electron can be controlled at the molecular level.

Figure 7:
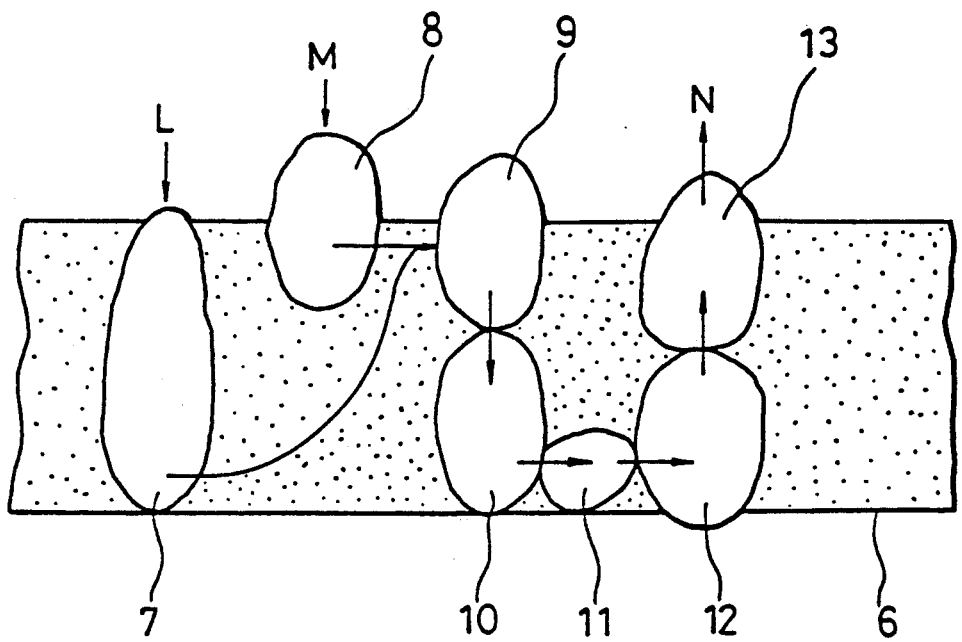
FIG. 7 is a diagram illustrating the electron transfer mechanism within a film of mitochondrion.

FIG. 7 schematically shows an electron transfer system within a film of mitochondrion as an example of an electron transfer protein chain. In the figure, reference numeral 6 designates the internal mitochondrion film, reference numerals 7 to 13 designate electron transfer protein molecules and the electrons extracted from the NADH in the area (L) and succinic acid in the area (M), which are reducing organisms, by NADH-Q reduction enzyme 7 and succinic acid dehydrogenaze, respectively, are transferred on a path from the NADH-Q reduction enzyme 7, the succinic acid dehydrogenaze 8, cytochrome b 9, cytochrome c1 10, cytochrome c 11, cytochrome a 12, and cytochrome a3 13, and finally to oxygen at the outlet side N, thereby producing an $H_2O$ molecule.

The electron transfer protein shown in FIG. 7 produces an oxidation/reduction (hereinafter referred as redox) reaction in the transfer of electrons and it is possible for an electron to flow from the negative level to the positive level of the redox potential of the respective electron transfer protein. In the midst of the electron transfer protein, the potential of the electron changes if the electron is excited by irradiation with light.

According to a recent finding, an electron transfer protein complex capable of transferring an electron can be produced not only by combining electron transfer protein molecules existing in the same organism but also by combining electron transfer protein molecules from different kinds of organisms.

Therefore, by using two kinds of redox materials A and B having appropriate redox potentials and selecting one among them in which an electron may be excited by light and arranging these materials in layers of an A-B structure, it is possible to produce a molecular heterojunction generating a photocurrent and a photovoltage in response to incident light.

A photoresponsive element according to the present invention comprises a film of a first redox material, a film of a second redox material having a different redox potential from that of the first redox material and forming a junction with the first redox material film, and first and second electrodes respectively connected to the first redox material film and the second redox material film. The states of electrons in the first and second redox material molecules are controlled by light irradiation, thereby producing photoconductivity or generating a photovoltage.

In an embodiment of the present invention, as the first and second redox materials, flavin derivative, porphyrin derivative, viologen, methylene blue, indophenol, phenosafranine, annulene, neutral red, toluidine blue, gallocyanin, indigo, and pheno thiazine are used. Flavin derivative and porphyrin derivative are preferred since the redox reaction occurs stably in them because they are organism-stimulating materials and their electron mobilities are high.

As the flavin derivative, the compound which is represented by the general formula (I) is used.

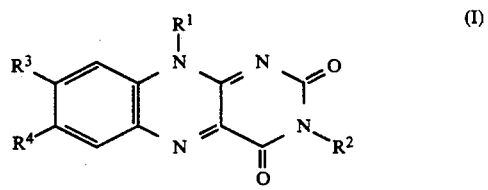

(I)

The $R^1$ and $R^2$ in the general formula (I) are respectively hydrogen or an alkyl group in the following combinations:

(i)
  $R^1$ is a hydrogen atom or an alkyl group having one to five carbon atoms,
  $R^2$ is an alkyl group having fifteen to twenty carbon atoms, (ii)
  $R^1$ is an alkyl group having six to twenty carbon atoms,
  $R^2$ is an alkyl group having six to twenty carbon atoms, (iii)
  $R^1$ is an alkyl group having fifteen to twenty carbon atoms,
  $R^2$ is a hydrogen atom or an alkyl group having one to five carbon atoms.

Because $R^1$ and $R^2$ are chosen according to the described combinations, polarity can be controlled. This makes it possible to produce a uniform monomolecular film on a water surface.

$R^3$ and $R^4$ are each substituents including a hydrogen atom, an alkyl group having one to five carbon atoms, and a carbonyl group, a methylthio acetyl acid group, or a methylthio succinic acid group. Since $R^3$ and $R^4$ are chosen from these groups, the number of negative ions per one molecule can be varied to be 0, 1, or 2. Further, the position of an isoalloxazin ring in the monomolecular film can be controlled. Furthermore, the orientation of the isoalloxazin ring in the monomolecular film can be controlled.

As a preferred embodiment of the flavin derivative,

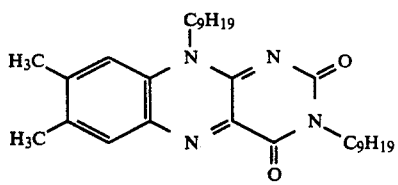

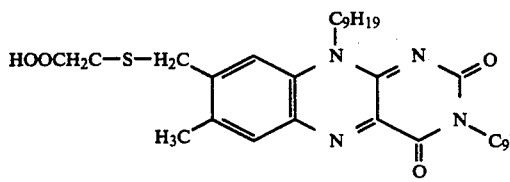

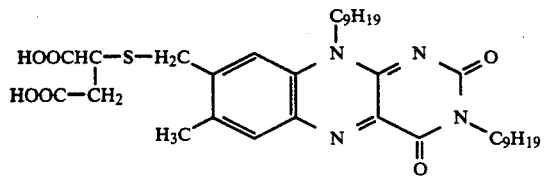

are used.

As the porphyrin derivative, compounds represented by the general formula (II):

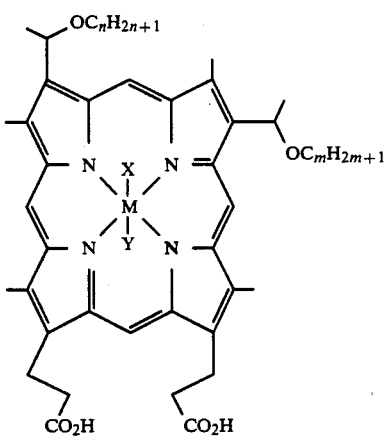

the general formula (III):

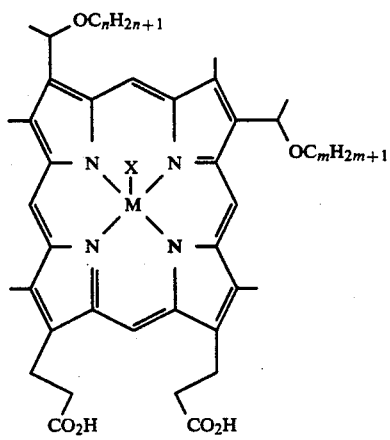

or the general formula (IV):

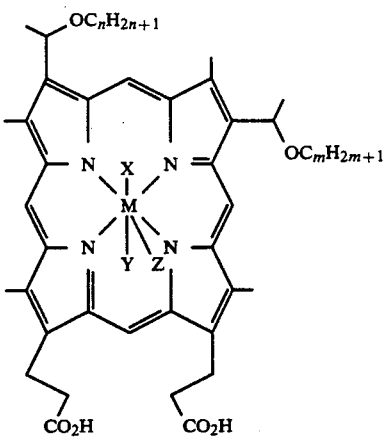

are used.

The M in the general formulae (II) to (IV) is Fe or Ru. Because M is Fe or Ru, the redox reaction between the two valence bond states and three valence bond states occurs stably.

The X, Y, and Z in the general formulae (II) to (IV) are ligands of M, and the structures (II), (III), and (IV) can be obtained depending on the kinds and numbers of valence bonds of M. X, Y, and Z are each a halogen atom, CO, —OCOCH$_3$, pyridine, imidazole, or P(OR$^5$)$_3$, or PR$^5{}_3$ (R$^5$ is a lower alkyl group of C1 to C4). When X, Y, and Z are not these atoms or groups, the stability of the two valence bond and the three valence bond states is low and likely to deteriorate. Herein, X and Y are the same or different.

The m and n subscripts in the general formulae (II) to (IV) are integers from 5 to 20 and preferably from 5 to 15. In a case where m and n are less than 5, the hydrophobic property of the compound which is represented by the general formulae (II) to (IV) is insufficient and it is impossible to produce a monomolecular film which is suitable for production of the LB film. On the other hand, when m and n exceed 20, the hydrophobic alkyl chain of the compound which is represented by the general formulae (II), (III), and (IV) is too long so that, in built-up films, comprising monomolecular films, the distance between the porphyrin rings between the layers is too long and the electron transfer characteristics are adversely affected. The m and n subscripts have the same or different values.

The alkali metallic salt of porphyrin metal complex is represented by the general formulae (II) to (IV). As the alkali metal, Na, K, and the like are used. The alkali metallic salt of the porphyrin metal complex in the present invention may be one in which one of the carboxyl groups in the general formulae (II) to (IV) is a salt or in which two of them are salts.

As a preferable example of the porphyrin derivative, the following is used:

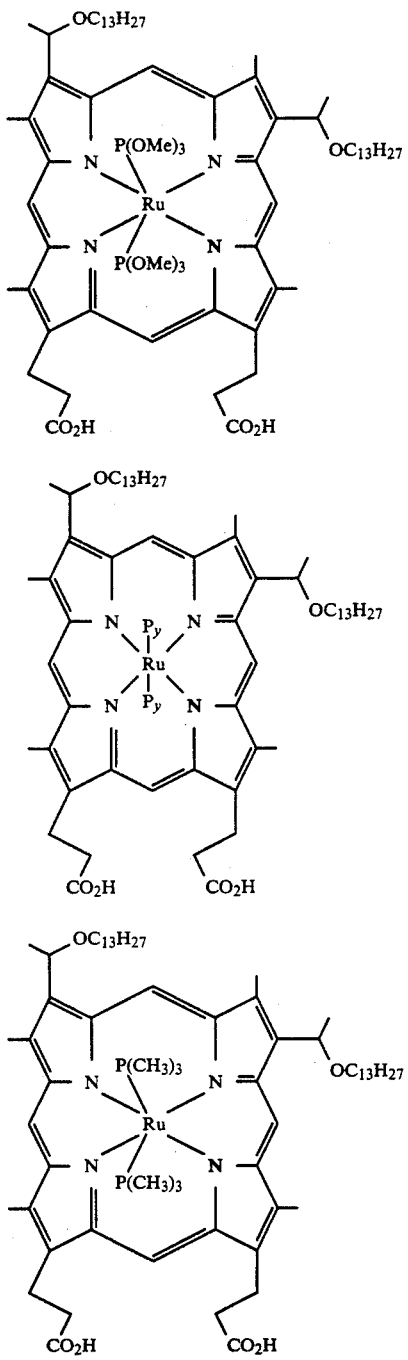

(Herein, Py represents pyridine.)

For the photoresponsive element of the present invention, a first redox material and a second redox material having different redox potentials are used. The difference in the redox potential is preferably 0.3 to 1.0 V for increasing electron speed and photoelectric conversion efficiency.

There are no restrictions on the combinations of the first redox material and the second redox material, but it is preferable to use one of a porphyrin derivative and a flavin derivative as the first redox material and the other of them as the second redox material because the redox potential difference is appropriate and the redox reaction proceeds stably, thereby resulting in a high electron transfer speed.

The first redox material film and the second redox material film preferably have thicknesses of 10 to 500 Angstroms, especially 10 to 100 Angstroms, for reducing the electron transit time and enhancing the response speed of the element. A film produced by the Langmuir-Blodgett method, molecular beam epitaxy (MBE), vacuum deposition, or chemical vapor deposition (CVD) may be used. A monomolecular film obtained by the LB method and a built-up film including about two to ten layers are preferable for holding a stable structure of monomolecular films of organic molecules. It is possible to control the orientation by suppressing the film pressure during production of the film by the LB method, and both flavin LB films and porphyrin LB films show good orientation at a film pressure of 25 to 32.4 mN/m (milli Newton per meter).

The details of the LB method are described in, for example:

(a) Irving Langmuir, *Journal of Japanese Society of Electrical Engineers*, Volume 55, pages 204–213, April 1935, (b) K. Boldgett, *Journal of American Chemical Society*, Volume 57, page 1007, 1935, (c) Michio Sugi et al, *Solid State Physics*, Volume 17, pages 744–752, 1982, and (d) *Journal of Colloid and Interface Science*, Volume 68, pages 471–477, 1979.

The photoresponsive element of the present invention comprises a substrate 1, a first redox material film 3 and a second redox material film 4 joined to each other, and a first electrode 2 connected to the first redox material film 3 and disposed on the substrate 1 and a second electrode 5 connected to the second redox material film 4, as shown in FIG. 1.

The electrodes are used to apply a predetermined voltage between the redox materials, and metallic electrodes of Ag, Au, Al, or transparent electrodes of $SnO_2$ or ITO are used.

The photoresponsive element of the present invention may include more than three kinds of redox material films.

The connection is easily obtained by producing the first redox material film by the LB method, MBE, or CVD and thereafter producing the second redox material film by the LB method. Light of a wavelength which is absorbed by the first and second redox material films is used to irradiate the structure. For example, in a case of flavin derivative, light of wavelength 250 to 520 nm is used. The light irradiation may be conventional and is not subject to particular restrictions.

In the photoresponsive element of the present invention as described above, the photocurrent generating efficiency is high and the photovoltage generated is high because two kinds of redox material having different redox potentials are used and a heterojunction generating charge carriers in response to the light irradiation is utilized. Furthermore, by using the monomolecular film or the monomolecular built-up film produced by the LB method as a redox material film, a photoresponsive element comprising a very thin film is produced and high speed light response is achieved. Furthermore, because the LB film can be produced independent of the crystallinity of the substrate, utilization as a three-dimensional element or as a hybrid element combined with conventional semiconductor elements, such as those utilizing Si, is possible.

In producing a photoresponsive element according to the invention, first, an electrode is produced on the substrate with an ion beam, a molecular beam, or by CVD. Next, a first redox material film is produced using the LB method in contact with the electrode. Thereafter, a second redox material film is produced on the first redox film using the LB method. When three or more redox material films are produced, that is, an element of A-B-A redox material structure is produced, another redox material film is produced. Next, an electrode is produced in contact with the redox material film at the uppermost surface, thereby completing a photoresponsive element according to the present invention.

An experimental example of the present invention will be described in greater detail with reference to FIGS. 1 and 2.

Figure 2:
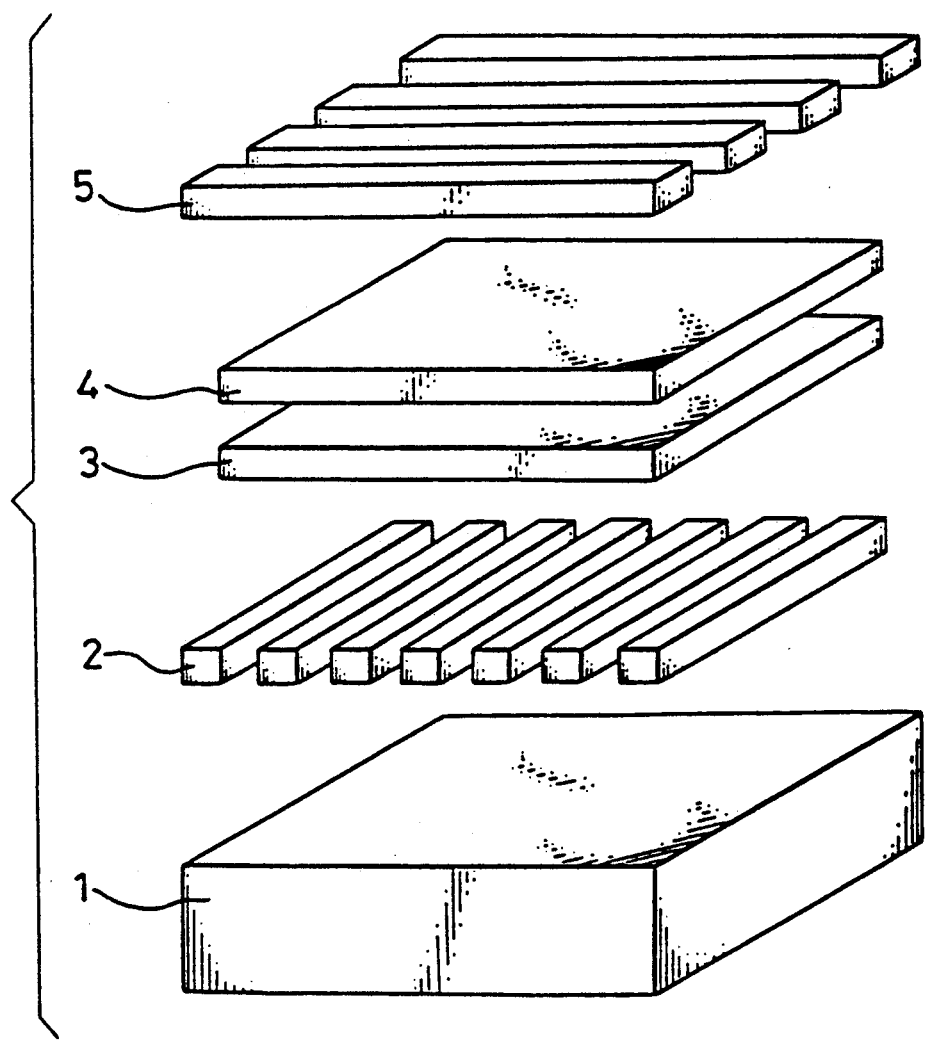
FIG. 2 is an exploded perspective view showing the photoresponsive element.

FIG. 1 shows a schematic cross-sectional view of a device including a photoresponsive element according to the present invention and FIG. 2 shows an exploded view of the device of FIG. 1.

An electrode 2 comprising a plurality of parallel aluminum stripes 100 Angstroms thick and 1 mm wide are produced on a glass substrate 1.

Utilizing this substrate including the electrode 2, three molecular layers of a porphyrin derivative (RPPH) represented by the following formula

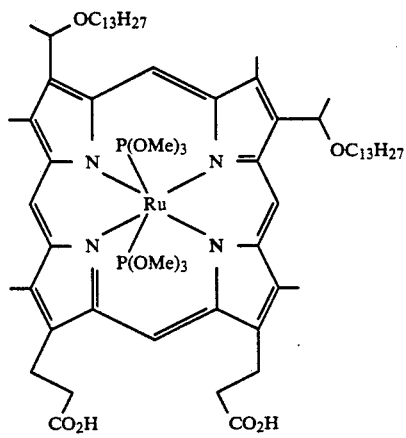

are deposited at a pressure of 27.5 mN/m by the LB method, thereby producing the first redox material film 3.

Next, four molecular layers of a flavin derivative represented by the formula

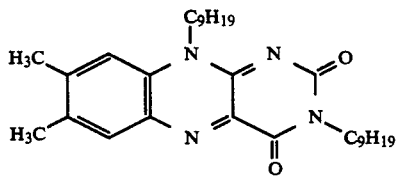

are deposited on the film 3 by the LB method at a film pressure of 30 mN/m, thereby producing the second redox material film 4. The difference in the redox potentials between the first redox material and the second redox material is 700 mV.

Next, a translucent second electrode 5 comprising a plurality of parallel aluminum stripes 100 Angstroms thick and 1 mm wide are produced transverse to the electrode 2.

The voltage vs current characteristics are measured with the photoresponsive element irradiated with light of wavelength 450 nm and a power of approximately 450 $\mu$W. The result is shown in FIG. 3.

Figure 3:
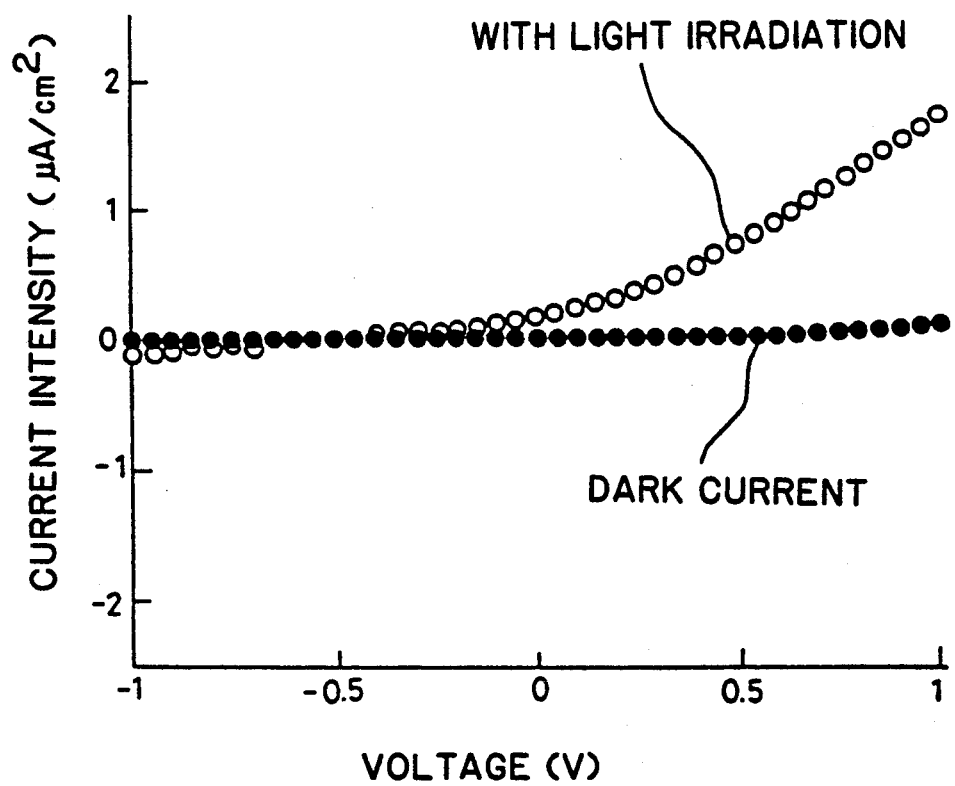
FIG. 3 is a graph showing the voltage vs current characteristics of the photoresponsive element of FIG. 1.
Figure 4A:
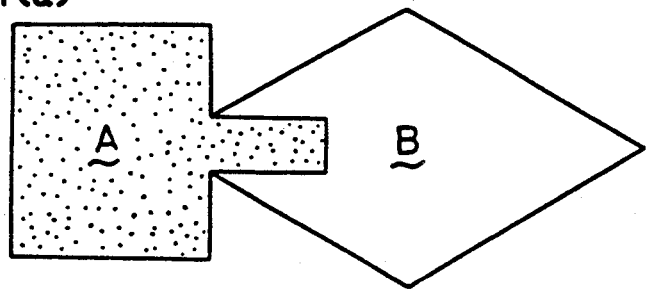
FIG. 4(a) is a diagram schematically showing the A-B type redox material junction and FIGS. 4(b) and 4(c) are diagrams showing the energy levels of the compounds.
Figure 4B:
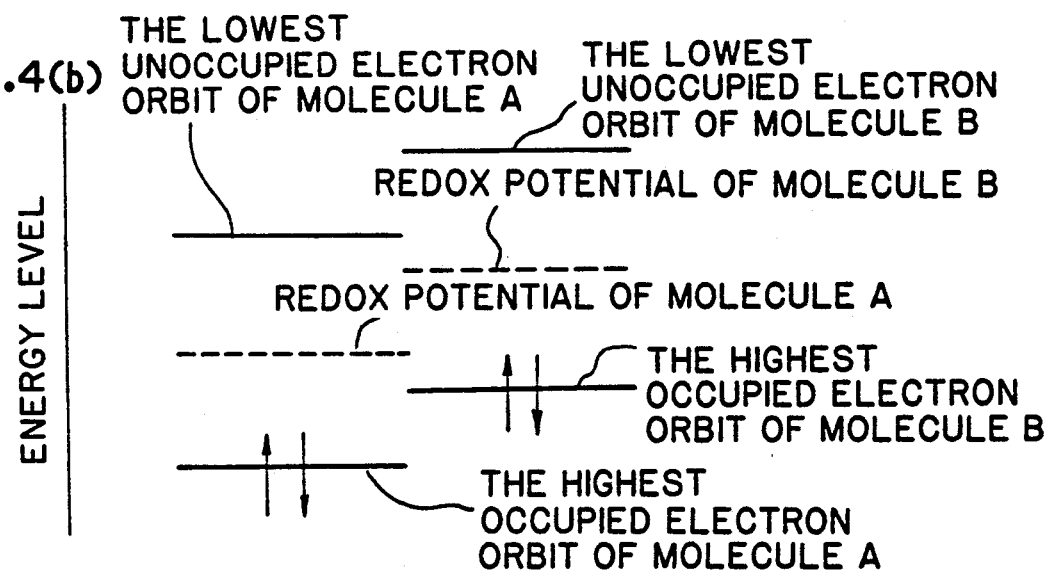
Figure 4C:
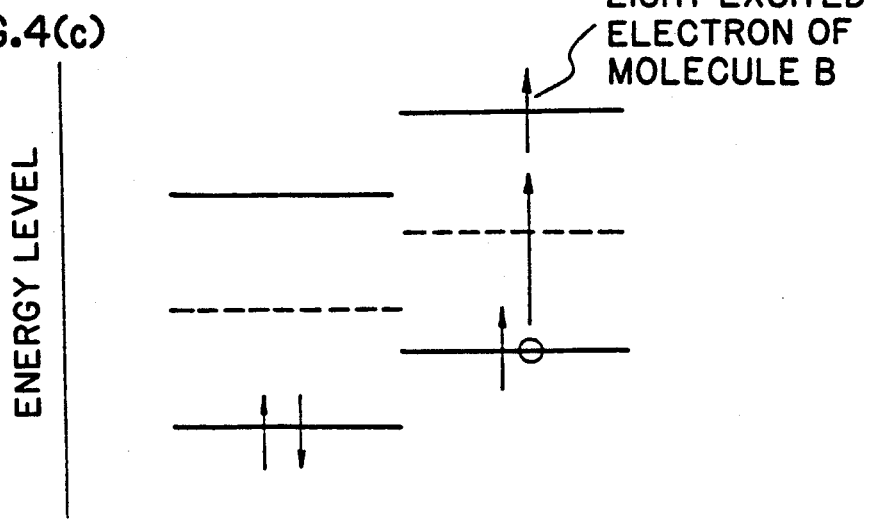
Figure 5:
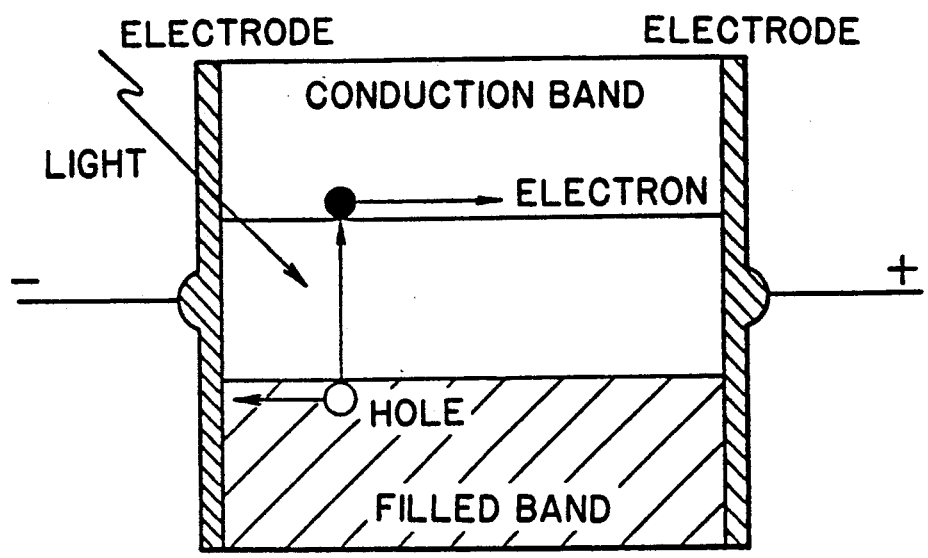
FIG. 5 is a diagram for explaining photoconductivity.
Figure 6:
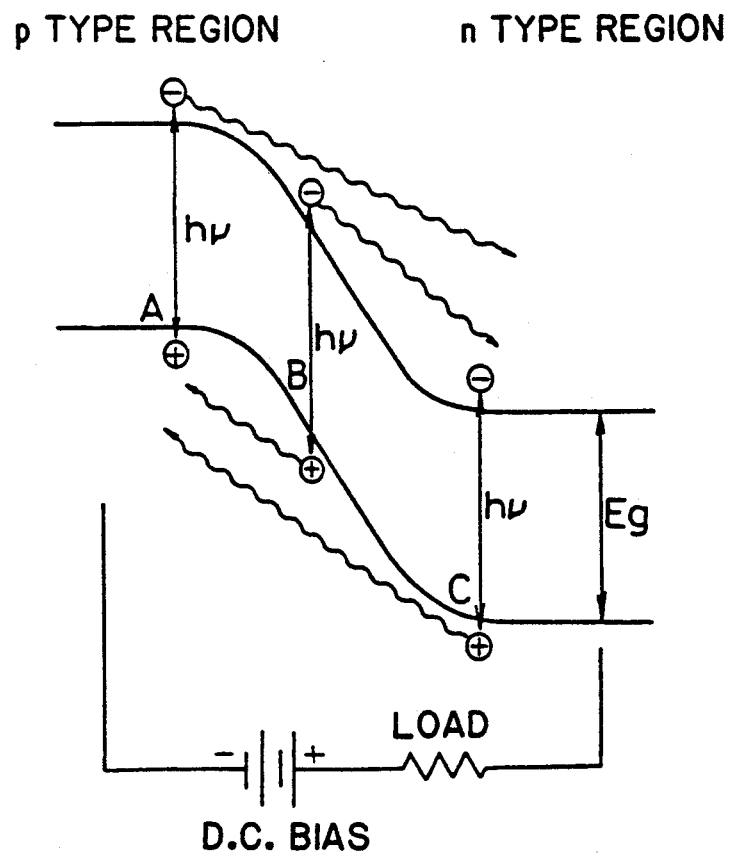
FIG. 6 is a diagram for explaining the photovoltaic effect.

From FIG. 3 it is apparent that a much larger current flows when the element is irradiated with light than when it is dark. A voltage is applied to the translucent electrode 5 while grounding the electrode 3. It is found that a large current flows when a voltage +1 volt is applied.

In the above-illustrated example, the monomolecular accumulative film of a porphyrin derivative and the monomolecular accumulative film of a flavin derivative are used for the first redox material film and the second redox material film, respectively, but these LB films may be monomolecular films. Furthermore, one of the two redox material films may be an LB film and the other not an LB film, or neither of the redox material films may be an LB film. Furthermore, the experimental example is an A-B type two layer structure but it may be an A-B-A multi-layer structure.

As is evident from the foregoing description, a photoresponsive element performing similarly to a conventional semiconductor photodiode, such as a pn junction diode, is realized and has a hyperfine molecular level size. Therefore, an optical image sensor of high density and high speed can be obtained. Furthermore, in the element of the present invention, the redox material films are easily formed regardless of the nature of the underlying substrate, simplifying fabrication of a three-dimensional element. This also simplifies a hybrid element comprising a conventional elemental semiconductor, such as Si, or a compound semiconductor, such as GaAs.

What is claimed is:

1. A photoresponsive molecular heterojunction structure comprising:
   first and second redox films having different redox potentials disposed in contact with each other, the first redox film comprising a porphyrin derivative and the second film comprising a flavin derivative having the general formula

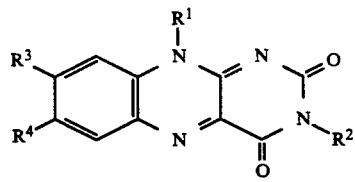

where $R^1$, $R^2$ are selected from the group consisting of hydrogen atoms and alkyl groups, and
(i) $R^1$ is a hydrogen atom or an alkyl group having 1 to 5 carbon atoms,
$R^2$ is an alkyl group having 15 to 20 carbon atoms, or
(ii) $R^1$ is an alkyl group having 6 to 20 carbon atoms,
$R^2$ is an alkyl group having 6 to 20 carbon atoms, or
(iii) $R^1$ is an alkyl group having 15 to 20 carbon atoms,
$R^{21}$ is a hydrogen atom or an alkyl group having 1 to 5 carbon atoms,
and $R^3$ and $R^4$ are each a substituent selected from the group consisting of hydrogen atoms, an alkyl group having 1 to 5 carbon atoms, a carbonyl group, a methylthio acetic acid group, and a methylthio succinic acid group;

a first electrode connected to the first redox film; and a second electrode connected to the second redox film.

2. The structure of claim 1 wherein the first and second redox films are each a monomolecular film or are each a built-up film formed by accumulating monomolecular films produced by the Langmuir-Blodgett technique.

3. A photoresponsive molecular heterojunction structure comprising:

first and second redox films having different redox potentials disposed in contact with each other, the first redox film comprising a flavin derivative and the second redox film is a porphyrin derivative comprising one of a porphyrin metal complex and its alkali metal salt having one of the following three formulae (II), (III), (IV):

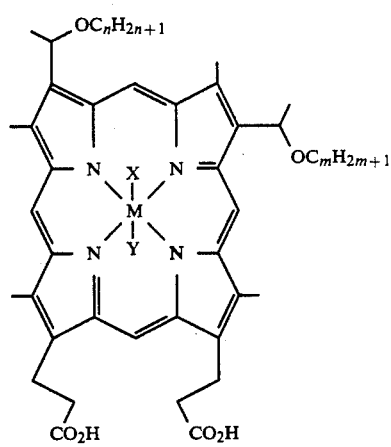

(II)

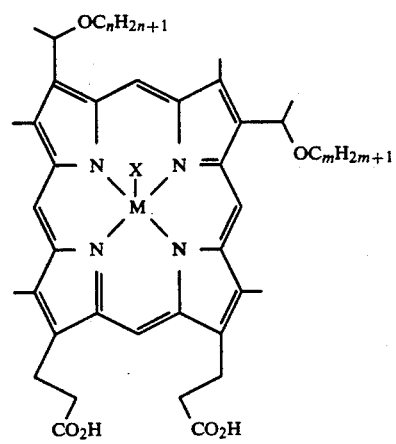

(III)

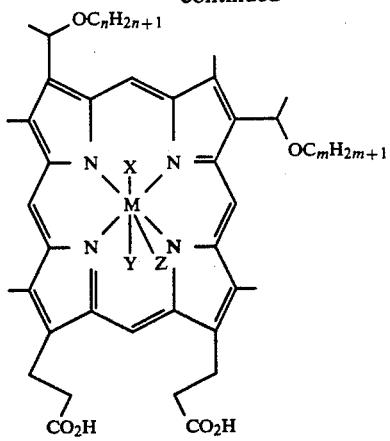

(IV)

where M is selected from the group consisting of Fe and Ru, X, Y, and Z are each a ligand of M selected from the group consisting of halogen atoms, CO, —OCOCH$_3$, pyridine, imidazole P(OR$^5$)$_3$, and PR$^5{}_3$ (where R$^5$ represents a lower alkyl group having 1 to 5 carbon atoms) and m and n may be the same or different integers from 5 to 20.

4. The structure of claim 3 wherein the first and second redox films are each a monomolecular film or are each a built-up film formed by accumulating monomolecular films produced by the Langmuir-Blodgett technique.

5. A method of generating a photovoltage comprising irradiating with light an element including a flavin derivative film having the general formula:

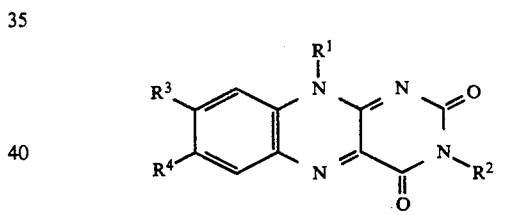

where R$^1$, R$^2$ are selected from the group consisting of hydrogen atoms and alkyl groups and
  (i) R$^1$ is a hydrogen atom or an alkyl group having 1 to 5 carbon atoms
  R$^2$ is an alkyl group having 15 to 20 carbon atoms
  (ii) R$^1$ is an alkyl group having 6 to 20 carbon atoms
  R$^2$ is an alkyl group having 6 to 20 carbon atoms
  (iii) R$^1$ is an alkyl group having 15 to 20 carbon atoms
  R$^{21}$ is a hydrogen atom or an alkyl group having 1 to 5 carbon atoms,
  and R$^3$ and R$^4$ are each a substituent selected from the group consisting of hydrogen atoms, an alkyl group having 1 to 5 carbon atoms, a carbonyl group, a methylthio acetic acid group, and a methylthio succinic acid group, and a porphyrin derivative film disposed in contact with said flavin derivative film, a first electrode connected to said flavin derivative film and a second electrode connected to said porphyrin derivative film whereby a photovoltage is produced between said first and second electrodes.

6. A method of generating a photovoltage comprising irradiating with light an element including a flavin derivative film and a porphyrin derivative film disposed in contact with said flavin derivative film, the porphyrin derivative being one of a porphyrin metal complex and its alkali metal salt having one of the following three formulae (II), (III), (IV):

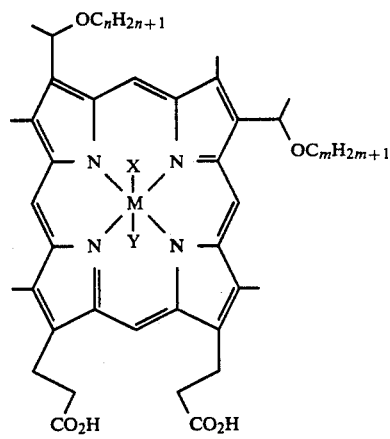

(II)

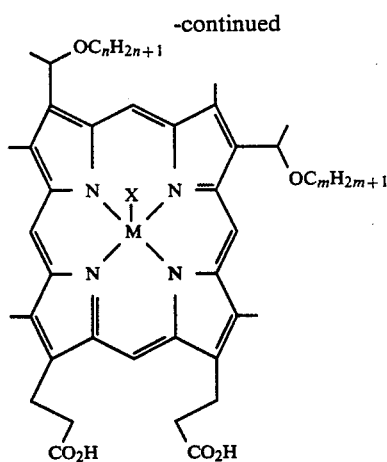

(III)

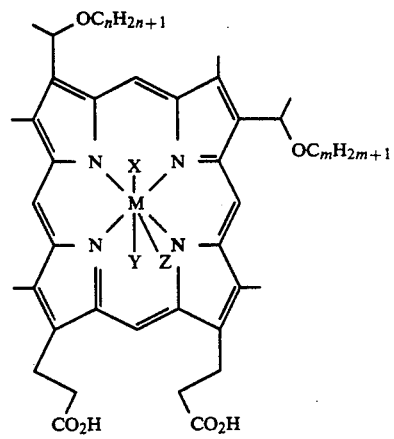

(IV)

where M is selected from the group consisting of Fe and Ru, X, Y, and Z are each a ligand of M selected from the group consisting of halogen atoms, CO, —OCOCH$_3$, pyridine, imidazole P(OR$^5$)$_3$, and PR$^5{}_3$ (where R$^5$ represents a lower alkyl group of C1 to C5 and m and n may be the same or different integers from 5 to 20, a first electrode connected to said flavin derivative film and a second electrode connected to said porphyrin derivative film whereby a photovoltage is produced between said first and second electrodes.

* * * * *